United States Patent [19]
Vermeersch et al.

[11] Patent Number: 5,922,511
[45] Date of Patent: *Jul. 13, 1999

[54] ON THE PRESS DEVELOPMENT OF A DIAZO BASED PRINTING PLATE

[75] Inventors: Joan Vermeersch, Deinze; Dirk Kokkelenberg, St. Niklaas; Johan Van Hunsel, Hasselt; Guido Hauquier, Nijlen, all of Belgium

[73] Assignee: Agfa-Gevaert, N.V., Mortsel, Belgium

[*] Notice: This patent issued on a continued prosecution application filed under 37 CFR 1.53(d), and is subject to the twenty year patent term provisions of 35 U.S.C. 154(a)(2).

[21] Appl. No.: 08/729,513

[22] Filed: Oct. 11, 1996

Related U.S. Application Data

[60] Provisional application No. 60/007,948, Dec. 4, 1995.

[30] Foreign Application Priority Data

Oct. 11, 1995 [EP] European Pat. Off. .............. 95202739

[51] Int. Cl.$^6$ ...................................................... G03F 7/32
[52] U.S. Cl. ........................ 430/302; 430/168; 101/451; 101/456; 101/467
[58] Field of Search .................................. 430/302, 168; 101/451, 456, 467

[56] References Cited

U.S. PATENT DOCUMENTS

| | | | |
|---|---|---|---|
| 3,971,660 | 7/1976 | Staehle | 430/302 |
| 4,284,705 | 8/1981 | Phlipot et al. | 430/302 |
| 5,403,694 | 4/1995 | Vermeersch et al. | 430/302 |
| 5,516,620 | 5/1996 | Cheng et al. | 430/302 |
| 5,607,816 | 3/1997 | Fitzgerald et al. | 430/302 |
| 5,620,827 | 4/1997 | ChenG et al. | 430/302 |
| 5,677,110 | 10/1997 | Chia et al. | 430/302 |

*Primary Examiner*—Christopher G. Young
*Attorney, Agent, or Firm*—Breiner & Breiner

[57] ABSTRACT

According to the present invention there is provided a method for making a lithographic printing plate comprising the steps of:

(1) image-wise exposing an imaging element having on a support in the order given (i) a uniform ink-repellant layer comprising a hydrophilic binder cross-linked by means of a hydrolysed tetra-alkylorthosilicate and (ii) a photosensitive layer comprising a diazonium salt or a diazo resin;

(2) and developing a thus obtained image-wise exposed imaging element by mounting it on a print cylinder of a printing press and supplying an aqueous dampening liquid and/or ink to said photosensitive layer.

The present invention also provides a method for making multiple copies of an original comprising the steps of:

(1) image-wise exposing an imaging element having on a support in the order given (i) a uniform ink-repellant layer comprising a hydrophilic binder cross-linked by means of a hydrolysed tetra-alkylorthosilicate and (ii) a photosensitive layer comprising a diazonium salt or a diazo resin;

(2) mounting a thus obtained image-wise exposed imaging element without development, on a print cylinder of a printing press;

(3) rotating said print cylinder while supplying an aqueous dampening liquid and/or supplying ink to said photosensitive layer of said imaging element and (4) transfering ink from said imaging element to a receiving element.

9 Claims, No Drawings

ON THE PRESS DEVELOPMENT OF A DIAZO BASED PRINTING PLATE

This patent claims the benefit of provisional application number 60/007948 filed Dec. 4, 1995.

FIELD OF THE INVENTION

The present invention relates to a method for making a printing plate involving the user of a diazo based printing plate. In particular, the method of the present invention involves on press development of a diazo based printing plate.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic materials is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Several types of supports can be used for the manufacturing of a diazo-sensitized lithographic printing plate. Common supports are metal supports like Al or Zn and paper bases. These supports, if not sufficient hydrophilic by themselves, are first coated with a hydrophilic layer to form the hydrophilic background of the printing plate and a top layer containing the diazo compound is then applied (see for example DE-P-1900469, DE-P-2030634 and U.S. Pat. No. 3,971,660).

It is known to use as hydrophilic layer in these systems a layer containing polyvinyl alcohol and hydrolyzed tetraethyl orthosilicate and preferably also silicium dioxide and/or titanium dioxide as described in e.g. EP-A 601240, GB-P-1419512, FR-P-2300354, U.S. Pat. Nos. 3,971,660 and 4,284,705. This hydrophilic layer is overcoated with a light-sensitive layer containing a diazo resin or a diazonium salt in a polymeric binder.

Upon image-wise exposure of the light-sensitive layer the exposed image areas become water insoluble and the unexposed areas remain water soluble. The plate is then developed with water to remove the diazonium salt or diazo resin in the unexposed areas.

Commercially available diazo based printing plates most commonly use an anodized and roughened aluminum as a support having a hydrophilic surface. However, commercial plates are also available that use a flexible support such as paper provided with a hydrophilic layer. For example, Lithocraft 10008 FOTOPLATE™ is a diazo based printing plate that comprises on a paper support a hydrophilic layer on top of which is provided a diazo based photosensitive layer. According to plate instructions of the supplier, a plate can be prepared by image-wise exposure of the lithographic printing plate precursor or imaging element, mounting the exposed imaging element on the press and wiping its surface with Lithocraft® 10008 Developer Desensitizer. The plate instructions also contemplate a method wherein no developer desensitizer is used. However, such method most often results in poor lithographic preformance so that in practice a Developer Desensitizer is almost always needed.

EP-A 601240 discloses a diazo based printing plate that uses a polyester film provided with a cross-linked hydrophilic layer as a lithographic base on which a photosensitive diazo layer is provided. Such a diazo based printing plate can be developed by rinsing it with plain water subsequent to image-wise exposure. However, in practical working conditions, where printing plates that are prepared are stored for some time and are often dried before mounting on the press, it was found that lithographic performance does not always meets the demands and in particular substantial dot gain and unwanted ink acceptance may occur. The dot gain is of particular concern as it may vary from one plate to the other making it difficult to compensate for it during plate preparation. Moreover, during development a substantial amount of liquid waste is generated.

SUMMARY OF THE INVENTION

It is an object of the present invention to improve the lithographic performance of a diazo based printing plate comprising as a lithographic base a support provided with an ink-repellant layer comprising a hydrophilic binder cross-linked with a hydrolysed tetra-alkylorthosilicate.

Further objects of the present invention will become clear from the description hereinafter.

According to the present invention there is provided a method for making a lithographic printing plate comprising the steps of:

(1) image-wise exposing an imaging element having on a support in the order given (i) a uniform ink-repellant layer comprising a hydrophilic binder cross-linked by means of a hydrolysed tetra-alkylorthosilicate and (ii) a photosensitive layer comprising a diazonium salt or a diazo resin;

(2) and developing a thus obtained image-wise exposed imaging element by mounting it on a print cylinder of a printing press and supplying an aqueous dampening liquid and/or ink to said photosensitive layer.

The present invention also provides a method for making multiple copies of an original comprising the steps of:

(1) image-wise exposing an imaging element having on a support in the order given (i) a uniform ink-repellant layer comprising a hydrophilic binder cross-linked by means of a hydrolysed tetra-alkylorthosilicate and (ii) a photosensitive layer comprising a diazonium salt or a diazo resin;

(2) mounting a thus obtained image-wise exposed imaging element without development, on a print cylinder of a printing press;

(3) rotating said print cylinder while supplying an aqueous dampening liquid and/or supplying ink to said photosensitive layer of said imaging element and (4) transfering ink from said imaging element to a receiving element, which is generally a sheet of paper.

DETAILED DESCRIPTION OF THE INVENTION

It has been found that by development of an imaging element in accordance with the present invention on the printing press, excellent lithographic performance is obtained and in particular an improved performance is obtained as compared to conventional development wherein the imaging element is developed before mounting it on the press. Moreover, no particular liquid such as a developer desensitizer needs to be wiped on the exposed imaging element to achieve this lithographic performance.

Preferably, the photosensitive layer of an image-wise exposed imaging element in accordance with the present invention is wiped with e.g. a cotton pad or sponge soaked with water before mounting the imaging element on the press or at least before the printing press starts running. This will remove some unexposed diazonium salt or diazo resin but will not actually develop the imaging element. However, it has the advantage that possible substantial contamination of the dampening system of the press and ink used is avoided.

An exposed imaging element in accordance with the present invention is preferably mounted on a printing press and used to print shortly after the exposure. It is however possible to store an exposed imaging element for some time in the dark before using it on a printing press to print copies.

The imaging element for use in accordance with the present invention comprises on a support in the order given (i) an ink-repellant layer comprising a hydrophilic binder being cross-linked by means of a hydrolysed tetra-alkylorthosilicate (ii) a photosensitive layer comprising a diazonium salt or a diazo resin.

As hydrophilic binder in the ink repellant layer there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

Examples of hydrolyzed tetraalkyl orthosilicate crosslinking agents are hydrolyzed tetraethyl orthosilicate and hydrolyzed tetramethyl orthosilicate.

The amount of tetraalkyl orthosilicate crosslinking agent is preferably at least 0.2 parts by weight per part by weight of hydrophilic binder, preferably between 0.5 and 5 parts by weight, more preferably between 1.0 parts by weight and 3 parts by weight.

The ink repellant layer in the imaging element used in accordance with the present invention preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1967, pages 62 to 69 or alumina particles or particles having an average diameter of at least 100 nm which are particles of titanium dioxide or other heavy metal oxides. By incorporating these particles the surface of the ink repellant layer is given a uniform rough texture consisting of microscopic hills and valleys, which serve as storage places for water in background areas.

The thickness of the ink repellant layer in the material of this invention may vary in the range of 0.2 to 25 $\mu$m and is preferably 1 to 10 $\mu$m.

Examples of low-molecular weight diazonium salt for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde.

Examples of diazo resins useful in the present invention include condensation products of an aromatic diazonium salt as the light-sensitive substance. Such condensation products are known and are described, for example, in German Pat. no. 1214086. They are in general prepared by condensation of a polynuclear aromatic diazonium compound, preferably of substituted or unsubstituted diphenylamine-4-diazonium salts, with active carbonyl compounds, preferably formaldehyde, in a strongly acid medium.

In addition to the diazo resin or diazonium salt the photosensitive layer according to the present invention preferably contains dispersed water-insoluble polymers. The aqueous dispersion of water insoluble polymer is preferably cationic or nonionic either e.g. as a result of an emulsifier or by having the cationic or nonionic group linked to the polymer. The water insoluble polymer is preferably a solid particulate having a size in the range of about 100 Angstroms to 1 micron in diameter and does not form a film below 30° C. In general, any polymer which carries a cationic or nonionic group or which can be formulated into an emulsion using a cationic or nonionic emulsifier can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, malei anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

Among the cationic and nonionic emulsifiers which can be used in the present invention are: ammonium salts of substituted amines containing alkyl and/or aryl groups attached to the nitrogen, alkyl or aryl sulfonium salts, alkyl and alkyl-aryl polyethers, cationic or nonionic fluorosurfactants and polyoles.

The thickness of the photosensitive layer in the material of this invention may vary in the range of 0.1 to 10 $\mu$m and is preferably between 0.5 and 2.5 $\mu$m.

The photosensitivity of an imaging element in connection with the present invention is preferably such that an exposure to day light to an extent of not more than 250 000 lux.s does not substantially result in changes in the lithographic behaviour of the printing plate. This will allow sufficient convenience in handling and mounting of an image-wise exposed imaging element. The photosensitivity of the imaging element may be easily adapted by appropriate choice of a particular diazo resin or diazonium salt, the amount thereof and the thickness of the photosensitive layer.

The imaging element in connection with the present invention advantageously contains water-soluble dyes such as rhodamines, sudan blue, methylen blue, eosin or trifenylmethane dyes such as crystal violet, victoria pure blue, malachite green, methylviolet and fuchsin or dye pigments. These colorants may be incorporated in the photosensitive layer and/or ink-repellant layer.

Various supports may be used for the imaging element in accordance with the present invention provided it has been treated to provide a surface to which the ink-repellant layer can be applied and adheres. Examples of such supports are photographic film bases e.g. substrated polyethylene terephthalate film, cellulose acetate film, plastics having metal layer or deposit thereon, a metal support, e.g. aluminium and polyolefin (e.g. polyethylene) coated paper, the polyolefin surface of which may have been subjected to a corona.

According to a particular preferred embodiment in connection with the present invention, a polyester film support is used to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is 200 mg per m$^2$ and 750 mg per m$^2$. Further, the ratio of silica to hydrophilic binder is preferably more than 1 and the surface area of the colloidal silica is preferably at least 300 m$^2$ per gram, more preferably a surface area of 500 m$^2$ per gram.

In accordance with the present invention, the imaging element may comprise additional layers. In particular it is preferred to include an intermediate layer between the ink-repellant layer and the photosensitive layer to improve the developability of the imaging element. A particular suitable intermediate layer for this purpose is disclosed in EP-A 601240 and comprises an organic compound having cationic groups. The organic compounds having cationic groups are preferably hydrophilic and may be low molecular weight compounds but are preferably polymers. Preferred compounds are those having one or more ammonium groups or amino groups that can be converted to ammonium groups in an acidic medium. An especially preferred type of cationic compounds are polysacharides modified with one or more groups containing an ammonium or amino group.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is exposed in such a way that the image obtained thereon is right reading. The exposure may be an exposure using optics or a contact exposure.

Subsequent to image-wise exposure, the image-wise exposed imaging element, after optional wiping, is mounted on a print cylinder of a printing press with the backside of the imaging element (side of the support opposite to the side having the photosensitive layer). According to a preferred embodiment, the printing press is then started and while the print cylinder with the imaging element mounted thereon rotates, the dampener rollers that supply dampening liquid are dropped on the imaging element and subsequent thereto the ink rollers are dropped. Generally, after about 10 revolutions of the print cylinder the first clear and useful prints are obtained.

According to an alternative method, the ink rollers and dampener rollers may be dropped simultaneously or the ink rollers may be dropped first.

Suitable dampening liquids that can be used in connection with the present invention are aqueous liquids generally having an acidic pH and comprising an alcohol such as isopropanol. With regard to dampening liquids useful in the present invention, there is no particular limitation and commercially available dampening liquids, also known as fountain solutions, can be used.

The invention will now be illustrated by the following examples without however the intention to limit the invention thereto. All parts are by weight unless stated otherwise.

EXAMPLE 1

Preparation of a Lithographic Base

To 440 g of a dispersion cont. 21.5% TiO$_2$ (average particle size 0.3 to 0.5 μm) and 2.5% polyvinyl alcohol in deionized water were subsequently added, while stirring, 250 g of a 5% polyvinyl alcohol solution in water, 105 g of a hydrolyzed 22% tetramethylorthosilicate emulsion in water and 12 g of a 10% solution of a wetting agent.

To this mixture was added 193 g of a deionized water and the pH was adjusted to pH=4.

The obtained dispersion was coated on a polyethyleneterephthalate film support (coated with a hydrophilic adhesion layer) to a wet coating thickness of 50 g/m$^2$, dried at 30° C. and subsequently hardened by subjecting it to a temperature of 57° C. for 1 week.

To this base was further provided an aqueous solution of (pH=5) of Dormacid (a dextran modified with a diethylaminoethyl group available from Pfeifer & Langen) and a cationic wetting agent to a dry coating thickness of 100 mg Dormacid per m$^2$.

The obtained element was then heated for 1 week at 57° C.

Preparation of the Imaging Element

An imaging element was produced by preparing the following light sensitive composition and coating it to the above described lithographic base in an amount of 35 g/m$^2$ (wet coating amount) and drying it at 30° C.

Preparation of the Light Sensitive Coating

To 63 g of a 20% dispersion of polymethylmethacrylate (particle diameter of 40 nm) stabilized with cetyltrimethylammonium bromide in deionized water was subsequently added, while stirring, 120 g of a 5% solution of a 98% hydrolized polyvinylacetate, having a number average molecular weight of 200 000 g/mol (MOWIOL™ 56-98 available from Hoechst), in water and 15 g of a 10% dispersion of Heliogen™ blue (BASF) and 5% polyvinyl alcohol (MOWIOL™ 56-98) in water. 46 g of a 15% solution of the condensation product of diphenylamine diazonium salt and formaldehyde (NEGALUX™ N18 available from PACS) and 20 g of a 15% solution of the condensation product of methoxy-diphenylamine diazonium salt and formaldehyde (DIAZO No. 8 available from Fairmount) in water was then slowly added. Finally 30 g of a 1.6% solution of cationic fluor containing surfactant (Fluorad™ FC135 available from 3M) in water, and 726 ml of water were added.

Preparation of a Printing Plate and Making of Copies of the Original

An imaging element as described above was exposed through an original (mask) to a high pressure halogen mercury vapour lamp of 1000 Watt at a distance of 70 cm for 90s. The exposed imaging element was then mounted on an ABD360™ offset printing press equipped with a VARN™ KOMPAC II dampening system. As ink, VanSon RB2329™ and as dampening liquid G671c™ (3% in water) commercially available from Agfa-Gevaert NV were used.

Subsequently, the press was started by allowing the print cylinder with the imaging element mounted thereon to rotate. The dampener rollers of the press were then dropped on the imaging element so as to supply dampening liquid to the imaging element and after 25 revolutions of the print cylinder, the ink rollers were also dropped to supply ink. After 10 further revolutions clear prints were obtained with no ink uptake in the non-image parts.

EXAMPLE 2

An imaging element was prepared and exposed as described in example 1. Subsequent to the exposure the imaging element was wiped with wetted sponge.

Subsequent the exposed imaging element was mounted on a printing press as described in example 1. The print cylinder was started and the dampener rollers were dropped on the imaging element. After 5 revolutions, the ink rollers were dropped and after 5 more revolutions, clear copies with no ink uptake in the non-image areas were obtained.

EXAMPLE 3 (COMPARATIVE)

An imaging element prepared and exposed as describe din example 1 was developed as follows. The exposed imaging element was put on a flat and solid surface and rinsed with water while wiping its surface with a soft sponge and applying a firm pressure until all non-exposed are areas of the imaging element were removed. The plate was then further rinsed with water and gently wiped with a sponge. Excess water was then removed and the plate was buffed dry with a soft paper.

The plate was further allowed to air-dry in a yellow light room (20° C. & 50% relative humidity) avoiding exposure to UV-light during 2 hours. The plate was then mounted on the printing press and printing was started as described in example 2. Clear copies without ink uptake in the non-image areas were obtained. However, a substantial larger dot gain than in case of examples 1 and 2 was observed.

EXAMPLE 4 (COMPARATIVE)

An imaging element was prepared, exposed and developed as described in example 3. The obtained plate was then stored for two hours in normal daylight (440 lux, 20° C. & 50% relative humidity). Subsequent thereto the plate was used to print as described in example 3. During at least the first 20 copies ink uptake in the non-image areas was observed and moreover a substantial larger dot gain than in case of examples 1 and 2 was observed.

We claim:

1. A method for making a lithographic printing plate comprising the steps of:
   (1) image-wise exposing an imaging element consisting of a support and in the order given (i) a uniform ink-repellant layer comprising a hydrophilic binder cross-linked by means of a hydrolyzed tetra-alkylorthosilicate and (ii) a photosensitive layer comprising a diazonium salt or a diazo resin;
   (2) and developing a thus obtained image-wise exposed imaging element by mounting it on a print cylinder of a printing press and supplying an aqueous dampening liquid and/or ink to said photosensitive layer while rotating said print cylinder.

2. A method according to claim 1 wherein said imaging element further comprises an intermediate layer being comprised between said ink-repellant layer and said photosensitive layer, said intermediate layer comprising an organic compound having a cationic group.

3. A method according to claim 2 wherein said organic compound is a polysacharide having one or more cationic groups.

4. A method according to claim 1 wherein said hydrophilic binder is polyvinyl alcohol.

5. A method for making multiple copies of an original comprising the steps of:
   (1) image-wise exposing an imaging element consisting of a support in the order given (i) a uniform ink-repellant layer comprising a hydrophilic binder cross-linked by means of a hydrolyzed tetra-alkylorthosilicate and (ii) a photosensitive layer comprising a diazonium salt or a diazo resin;
   (2) mounting a thus obtained image-wise exposed imaging element without development, on a print cylinder of a printing press;
   (3) rotating said print cylinder while supplying an aqueous dampening liquid and supplying ink to said photosensitive layer of said imaging element and
   (4) transfering ink from said imaging element to a receiving element.

6. A method according to claim 5 wherein said imaging element further comprises an intermediate layer being comprised between said ink-repellant layer and said photosensitive layer, said intermediate layer comprising an organic compound having a cationic group.

7. A method according to claim 6 wherein said organic compound is a polysacharide having one or more cationic groups.

8. A method according to claim 5 wherein said hydrophilic binder is polyvinyl alcohol.

9. A method according to claim 5 wherein said image-wise exposed imaging element is wiped before rotating said print cylinder while supplying dampening liquid and/or ink.

* * * * *